United States Patent [19]

Su et al.

[11] Patent Number: 5,213,875
[45] Date of Patent: May 25, 1993

[54] UV CONFORMAL COATINGS

[75] Inventors: Wei-Fang A. Su, Murrysville; Anthony P. Barrett, Munhall, both of Pa.

[73] Assignee: Westinghouse Electric Corp., Pittsburgh, Pa.

[21] Appl. No.: 241,679

[22] Filed: Sep. 7, 1988

Related U.S. Application Data

[63] Continuation-in-part of Ser. No. 102,972, Sep. 30, 1987, abandoned.

[51] Int. Cl.$^5$ .................. C08F 2/50; C08F 220/32; C08F 226/02; C08L 63/10
[52] U.S. Cl. ..................... 428/209; 427/520; 522/43; 522/79; 522/92; 522/103; 525/484; 525/922
[58] Field of Search .............. 522/92, 43, 79, 92, 522/103; 428/209; 427/520; 525/482, 922

[56] References Cited

U.S. PATENT DOCUMENTS

| | | | |
|---|---|---|---|
| 4,169,732 | 10/1979 | Shipley | 522/94 |
| 4,222,835 | 9/1980 | Dixon | 428/251 |
| 4,271,258 | 6/1981 | Watariguchi | 522/92 |
| 4,282,269 | 8/1981 | Lucey | 427/54.1 |
| 4,317,858 | 3/1982 | Sattler | 522/103 |
| 4,336,311 | 6/1982 | Lucey | 428/521 |
| 4,357,219 | 11/1982 | Sattler | 522/92 |
| 4,415,604 | 11/1983 | Nativi | 525/455 |
| 4,424,252 | 1/1984 | Nativi | 428/209 |
| 4,451,523 | 5/1984 | Nativi et al. | 428/209 |
| 4,481,258 | 11/1984 | Sattler et al. | 522/103 |
| 4,618,632 | 10/1986 | Su | 522/93 |
| 4,668,713 | 5/1987 | Woods et al. | 522/174 |
| 4,690,987 | 9/1987 | Sakakibara | 525/920 |
| 4,999,136 | 3/1991 | Su et al. | 428/901 |

FOREIGN PATENT DOCUMENTS 2175908 12/1986 United Kingdom.

Primary Examiner—Marion E. Mc Camish
Assistant Examiner—Arthur H. Koeckert

[57] ABSTRACT

Resin compositions comprising 20 to 50% by weight, based on total composition weight, of a first resin which comprises an acrylate-epoxy oligomer having a molecular weight of from 2000 to 5000; from 2 to 10% of a second resin which comprises an acrylate-urethane oligomer; up to 50% of a third resin which comprises a second acrylate-epoxy oligomer, where from 1 to 5% of the epoxy is an epoxy novolac; from 10 to 40% of a liquid acrylate; from 2 to 20% of a liquid diacrylate having an ether linkage; from 5 to 25% of a liquid alkylene diacrylate; and from 1 to 5% of a UV photoinitiator. The compositions also preferably includes from 0.05 to 1% of a flow control agent. The compositions are applied to substrates such as printed wiring boards and cured with ultraviolet light to form a conformal coating on the substrate.

16 Claims, No Drawings

UV CONFORMAL COATINGS

CROSS REFERENCE TO A RELATED APPLICATION

This application is a continuation-in-part of U.S. Ser. No. 102,972, filed Sep. 30, 1987 and entitled "UV Conformal Coatings", now abandoned.

TECHNICAL FIELD

The invention relates to compositions that can be applied to various substrates and cured with ultraviolet (UV) light to form a conformal coating on the substrate, particularly where the substrate is a printed wiring board.

BACKGROUND OF THE INVENTION

After electronic components have been mounted on printed wiring boards, a conformal coating is usually applied to the boards to protect the components from hostile environments such as high humidity and the presence of corrosive vapors. Conventional solvent-based conformal coating compositions produce coatings having good properties, but the compositions require a long time to dry (at least 5 minutes) and harmful solvents are evolved during the curing process. The best conformal coating today is considered to be "Parylene"; however, "Parylene" has to be processed by vacuum pyrolysis deposition, a very expensive and patented process.

Conformal coatings that are UV curable have the advantages that they can be cured rapidly (in seconds) with no volatile organic compounds being emitted, so they are well suited for an automated electronic assembly line. However, until now, an easily processed UV curable conformable coating composition which has the appropriate viscosity, has good tank life, and is capable of forming a coating having the required properties, has not been made.

DISCLOSURE OF THE INVENTION

Accordingly, the present invention resides in a UV curable resin composition characterized in that said composition comprises: (A) from 20 to 50% by weight, based on total composition weight, of a first resin which comprises an unsaturated epoxy oligomer having a molecular weight of from 2000 to 5000, where the epoxy in said oligomer is a bisphenol epoxy, or mixtures thereof; (B) from 2 to 10% by weight, based on total composition weight, of a second resin which comprises an acrylate-urethane oligomer; (C) from 0 to 50% by weight, based on total composition weight, of a third resin which comprises a second unsaturated epoxy oligomer, where from 1 to 5 mole percent of the epoxy in said second oligomer is an epoxy novolac and from 95 to 99 mole percent is a bisphenol epoxy such as bisphenol A epoxy, bisphenol S epoxy, bisphenol F epoxy or mixtures thereof; (D) from 10 to 40% by weight, based on total composition weight, of a liquid mono-acrylate; (E) from 2 to 20% by weight, based on total composition weight, of a liquid diacrylate containing an ether linkage; (F) from 5 to 25% by weight, based on total composition weight, of a liquid alkylene diacrylate where the alkylene group has from 2 to 8 carbon atoms; and (G) from 1 to 5% by weight, based on total composition weight, of a UV photoinitiator.

Preferably, the UV curable resin composition comprises (A) from 35 to 45% by weight, based on total composition weight, of a first resin which comprises (1) a first acrylate-epoxy oligomer having a molecular weight of from 2000 to 5000, prepared by reacting an anhydride or a diacid with a hydroxy acrylate followed by reaction with a bisphenol epoxy such as bisphenol A epoxy, bisphenol S epoxy, or mixtures thereof; (2) from 10 to 50% by weight, based on first resin weight, of a liquid acrylate; and (3) from 0.01 to 0.1% by weight, based on first resin weight, of an epoxy catalyst; (B) from 4 to 6 percent by weight, based on total composition weight, of a second resin which comprises (1) an acrylate-urethane oligomer prepared by reacting a diisocyanate with a hydroxy acrylate to form a urethane followed by reaction of said urethane with caprolactam; and (2) from 10 to 50% by weight, based on second resin weight, of a liquid acrylate solvent; (C) from 20 to 45% by weight, based on total composition weight, of a third resin which comprises (1) a second acrylate-epoxy oligomer having a molecular weight of from 2000 to 5000, prepared by reacting a hydroxy acrylate with an anhydride or a diacid followed by reaction with epoxy, where said epoxy is from 1 to 5 mole percent epoxy novolac and from 95 to 99 mole percent bisphenol A epoxy, bisphenol S epoxy or mixtures thereof; (2) from 10 to 50% by weight, based on third resin weight, of a liquid acrylate; and (3) from 0.01 to 0.1% by weight, based on third resin weight, of an epoxy catalyst; (D) from 30 to 35% by weight, based on total composition weight, of a liquid mono-acrylate; (E) from 4 to 7% by weight, based on total composition weight, of a liquid diacrylate having an ether linkage; (F) from 7 to 15% by weight, based on total composition weight, of a liquid alkylene diacrylate having from 2 to 8 $CH_2$ linkages; (G) from 3 to 4% by weight, based on total composition weight, of a UV photoinitiator; and (H) from 0.05 to 0.1% by weight, based on total composition weight, of a flow control agent.

This invention also includes a method of making a UV curable resin composition comprising (A) preparing a first resin by reacting a hydroxy acrylate with an anhydride or diacid to produce an ester having free carboxyl or anhydride groups, further reacting said ester with a bisphenol epoxy such as bisphenol A, bisphenol S epoxy, or mixtures thereof to produce an acrylate-epoxy oligomer, and solubilizing said oligomer with from 10 to 50% by weight, based on the weight of said first resin, of a liquid acrylate; (B) preparing a second resin by reacting a diisocyanate with a hydroxy acrylate to form a urethane, followed by reacting said urethane with caprolactam to form an acrylate-urethane oligomer, and solubilizing said oligomer with from 10 to 50% by weight, based on the weight of said second resin, of a liquid acrylate; (C) preparing a third resin by reacting a hydroxy acrylate with an anhydride or diacid to produce an ester having free carboxyl or anhydride groups, further reacting said ester with from 95 to 99 mole percent of bisphenol A epoxy, bisphenol S epoxy or mixtures thereof, and from 1 to 5 mole epoxy novolac, to produce an acrylate-epoxy oligomer, and solubilizing said oligomer with from 10 to 50% by weight, based on the weight of said third resin, of a liquid acrylate; (D) mixing together (1) from 20 to 50% said first resin; (2) from 2 to 10% said second resin; (3) up to 50% said third resin; (4) from 10 to 40% liquid mono-acrylate; (5) from 2 to 20% liquid diacrylate containing an ether linkage; (6) from 5 to 25% liquid alkylene diacrylate having 2 to 8 CH₂ groups; and (7) from 1 to 5% UV photoinitiator.

We have discovered that UV curable conformal coating compositions can be made from at least two different resins, a liquid monoacrylate, a liquid diacrylate having an ether linkage, a liquid alkylene diacrylate, a photoinitiator, and an optional flow control agent.

Unlike other UV conformal coating compositions, the UV curable conformal coating composition of this invention is a single component system, which means that it is not necessary to mix together two separate components immediately before the composition is used. This has the advantage for the user of saving an additional processing step and it avoids problems that can occur when the components are mixed in the wrong proportions or are improperly mixed. While the UV curable conformal coating composition of this invention is only a single component, it nevertheless has a long shelf life, of at least 6 months. The composition has a low viscosity, which enables it to flow readily over various components on an electronic printed wiring board. Once applied to the board, the composition cures rapidly, typically in less than 5 seconds, with low shrinkage.

Also, unlike other UV curable conformal coating systems, the UV curable conformal coating system of this invention does not require a thermal post cure or a moisture cure. The absence of a thermal post cure is important because heat can damage the electronic components on a circuit board; a moisture cure can corrode or short circuit electronic components. Not only is the UV curable conformal coating of this invention curable only with UV light, but we have also found that it will cure into shadows up to an area as large as 50×50 mils.

The coating has good hardness and yet is flexible enough that it will not crack. It also has good moisture resistance, good adhesion, good chemical resistance, and good electric properties such as a low dielectric constant. In addition, breaks in the coating an be repaired by means of soldering or other technique.

DESCRIPTION OF THE PREFERRED EMBODIMENTS

The UV curable conformal coating composition of this invention is a mixture of at least two different resins, a liquid acrylate, a liquid diacrylate having an ether linkage, a liquid alkylene diacrylate, a photoinitiator, and various optional components. It is an improvement upon the UV curable composition described in U.S. Pat. No. 4,481,258, herein incorporated by reference. Each of these components of the composition will now be described in detail.

FIRST RESIN

The first resin used in the UV curable conformal coating composition of this invention is an unsaturated epoxy oligomer dissolved in an acrylate solvent. The unsaturated epoxy oligomer is a compound having both ethylenic unsaturation and free epoxy groups, and a molecular weight of from 2000 to 5000. Oligomers having a lower molecular weight tend to form a coating that is too brittle, and oligomers having a higher molecular weight tend to make the composition too viscous and the coating too soft. Acrylic unsaturation is preferred as it cures faster, but allylic or vinylic unsaturation can also be used.

An acrylate-epoxy oligomer, the preferred oligomer, can be made by acrylating an epoxy resin. For example, an epoxy resin can be acrylated in a two-step reaction. In the first step, a hydroxy acrylate, a compound having both acrylate groups and a single hydroxyl group, is reacted with an anhydride or a diacid to form an ester having a free carboxylic acid group and a free acrylate group. The reaction occurs between a carboxylic acid group or an anhydride group of the diacid or anhydride, and a hydroxyl group of the hydroxy acrylate. Suitable hydroxy acrylates that can be used in this reaction include 2-hydroxyethyl acrylate (HEA), 3-hydroxypropyl acrylate, 2-hydroxy methacrylate, hydroxyethyl-betacarboxyethyl acrylate, 3-hydroxypropyl methacrylate, hydroxyhexyl acrylate, hydroxyoctyl methacrylate, 2-hydroxypropyl acrylate, and 2-hydroxyethyl methacrylate. Di and polyacrylates can also be used but they are not preferred as the resulting coatings may be too brittle. The preferred hydroxy acrylate is 2-hydroxyethyl acrylate because it is very reactive and results in a fast curing composition. Suitable anhydrides that can be used include trimellitic anhydride, maleic anhydride, methylbicyclo [2.2.1] heptene-2,3-dicarboxylic anhydride, phthalic anhydride, methylenedic anhydride, and hexahydrophthalic anhydride. Di or polyanhydrides can also be used but they are not preferred because they may cause the composition to gel. Suitable diacids that can be used include terephthalic acid, isophthalic acid, oxalic acid, adipic acid, and succinic acid. The preferred anhydride or diacid is trimellitic anhydride (TMA) because it gives a composition having a longer pot life and a coating that has better adhesion and better thermal stability.

The resulting ester is then reacted with an epoxy resin to form the acrylate-epoxy oligomer. The epoxy resin can have more than two epoxy groups, but diepoxides are preferred as polyepoxides may make the coating too brittle. The epoxy resin should be a bisphenol epoxy such as bisphenol A epoxy resin, or a bisphenol-S-epoxy resin as these epoxy resins promote the best adhesion of the coating to the surface. A bisphenol A epoxy resin is preferred because it is less expensive and promotes better adhesion of the coating to the substrate.

The epoxy resin should also be soluble in a liquid acrylate which is used as a solvent for the reactants. The liquid acrylate is later reacted into the coating. Examples of suitable liquid acrylates include phenol ethoxylate monoacrylate, tetrahydrofurfuryl methacrylate, cyclohexyl methacrylate, n-hexyl methacrylate, and 2-(2-ethoxyethoxy) ethyl acrylate. The preferred liquid acrylate is phenoxyethyl acrylate (PEA) because it is a good solvent for the oligomer. Sufficient liquid acrylate should be used to give the resin a workable viscosity; from 10 to 50% (by weight) of the liquid acrylate is usually sufficient.

An epoxy catalyst, such as a tertiary amine, (e.g. triethanolamine (TEA)), is also included in the resin. Generally, at least about 0.01% (all percentages herein are by weight unless otherwise indicated) catalyst (based on the weight of the first resin composition) is required, and more than about 0.1% catalyst should be avoided as it makes the reaction difficult to control and may result in clouding.

The purpose of reacting the hydroxy acrylate with the anhydride or diacid is to produce an acrylate that will react with an epoxy group of an epoxy resin. Therefore, the hydroxy acrylate, the anhydride or diacid, and the epoxy resin should be used in such proportions that in the acrylate-epoxy oligomer all groups are reacted except for the acrylate group on the hydroxy acrylate and one epoxy group The reaction proceeds with moderate heat at from 140° to 150° C. and is finished when the acid number is less than 5.

SECOND RESIN

The second resin used in preparing the UV curable conformal coating is based on an acrylate-urethane oligomer, a compound that has both a free acrylate group and a urethane group. This oligomer can be prepared by reacting a diisocyanate with a hydroxy acrylate. Examples of suitable diisocyanates include:

4,4'-diisocyanato diphenyl 2,2-propane (4,4'-diphenyl-2,2-propane diisocyanate)

4,4'-diisocyanato diphenyl methane (4,4'-diphenylmethane diisocyanate)

4,4'-diisocyanato benzidine (4,4'-diphenyl diisocyanate)

4,4'-diisocyanato diphenyl sulfur (4,4'-diphenylsulfide diisocyanate)

4,4'-diisocyanato diphenyl sulfone (4,4'-diphenylsulfone diisocyanate)

4,4'-diisocyanato diphenyl ether (4,4'-diphenylether diisocyanate)

4,4'-diisocyanato diphenyl 1,1-cyclohexane (4,4'-diphenyl-1,1-cyclohexane diisocyanate)

oxides of methyl- and of bis (meta-isocyanato-phenyl) phosphine(methyl and bis(meta-phenyl isocyanate) phosphine oxide)

diisocyanato 1,5-naphthalene (1,5-naphthalene diisocyanate)

meta-phenylene diisocyanate tolylene diisocyanate (toluylene diisocyanate or toluene diisocyanate)

3,3'-dimethyl diphenyl 4,4'-diisocyanate (dimethyl 3,3'-diisocyanato 4,4'-diphenylene)

3,3'-dimethoxy diphenyl 4,4'-diisocyanate (dimethoxy 3,3'-diisocyanato 4,4'-diphenylene)

meta-xylylene diisocyanate para-xylylene diisocyanate 4,4'-dicyclohexylmethane diisocyanate (diisocyanato 4,4'-dicyclohexyl methane)

hexamethylene diisocyanate dodecamethylene diisocyanate 2,11-dodecane diisocyanate (diisocyanato 2,11-dodecane)

bis(para-phenylene isocyanate 1,3,4-oxadiazole) para-phenylene bis(para-phenylene isocyanate), 1,3,4-oxadiazole bis(meta-phenylene isocyanate), 1,3,4-oxadiazole bis(meta-phenylene isocyanate)4-phenyl 1,2,4-triazole bis (4-paraphenylene isocyanate thiazole 2-yl) meta-phenylene (2-phenylene)5,4'-benzimidazole diisocyanate (2-phenylene)5,4'-benzoxazole diisocyanate (2-phenylene)6,4'-benzothiazole diisocyanate 2,5-bis(2-phenylene isocyanate benzimidazole-6-ene) 1,3,4-oxadiazole bis(para-phenylene isocyanate-2-benzimidazole-6-ene)

bis(para-phenylene isocyanate-2-benzoxazole-6-ene)

The preferred diisocyanate is tolylene diisocyanate (TDI) because it is inexpensive and has been found to work well.

Suitable hydroxy acrylates can be selected from the hereinabove provided list. The preferred hydroxy acrylate is 2-hydroxyethyl acrylate because it results in a faster reaction. In this reaction, an isocyanate group of the diisocyanate reacts with the hydroxyl group of the hydroxy acrylate to produce a urethane. This reaction is conducted in the presence of an inhibitor (i.e., a free radical scavenger) such as naphthoquinone, phenanthraquinone, 2,6-di-tert-butyl-4-methyl phenol, benzoquinone, hydroquinone, or methylquinone to prevent the spontaneous polymerization of acrylic groups. At least 0.01% inhibitor (based on the total weight of the second resin) should be used as if less inhibitor is used, the oligomer may gel. However, more than about 0.1% of the inhibitor should be avoided as the UV reactivity may then be low.

The reaction of the diisocyanate with the hydroxy acrylate proceeds readily at about 60° C. for 1 hour. A proportion of 1 equivalent of diisocyanate to 1 equivalent of the hydroxy acrylate should be used so that the resulting urethane compound has a free isocyanate group. That isocyanate group is then reacted with caprolactam to produce a urea linkage. The reaction with caprolactam can be performed at about 100° C. until no isocyanate peak is observed in an infrared absorption spectrometer. About 10 to about 50% by weight, based on the weight of the second resin, of a liquid acrylate is then added as a solvent to make the oligomer less viscous. Suitable liquid acrylates may be found in the list provided hereinabove, and PEA is again preferred. A description of the first and second resins can be found in U.S. Pat. No. 4,481,258.

THIRD RESIN

The third resin used in preparing the UV curable conformal coating is optional, but is preferably present as it increases the hardness of the coating. The third resin also contains an acrylate-epoxy oligomer and is prepared in the same way as the first resin, except that from 1 to 5 mol percent of a bisphenol epoxy such as bisphenol A, bisphenol S, or mixtures epoxy in the oligomer is replaced with an epoxy novolac. We have found that if more of the bisphenol A or bisphenol S is replaced, the oligomer may gel and if less is replaced, the coating hardness may not be increased. Examples of suitable epoxy in "Handbook of Epoxy Resins" by Lee and Neville, McGraw Hill Book Company (1967), herein incorporated by reference.

LIQUID ETHER DIACRYLATE

The compositions also include a liquid diacrylate that has an ether linkage. This compound performs the functions of reducing the viscosity and increasing the adhesion of the coating to the surface substrate. Examples of such liquid diacrylates include tetraethyleneglycol diacrylate (TEGDA), diethylene glycol diacrylate, ethoxylated bisphenol A diacrylate, and tripropylene glycol diacrylate. Tetraethyleneglycol diacrylate is preferred because it provides adequate cure speed, viscosity, and flexibility.

LIQUID ALKYLENE DIACRYLATE

Also included in the composition is a liquid alkylene diacrylate. This is a diacrylate that contains an alkylene linkage, where the alkylene linkage contains from 2 to 8 $CH_2$ groups. We have found that fewer than two $CH_2$ groups may increase the brittleness of the coating and more than eight may make it too soft. Examples of such liquid alkylene diacrylates include hexanediol diacrylate (HDDA), ethylene glycol diacrylate, 1,3-butylene glycol diacrylate, 1,4-butanediol diacrylate, and neopentyl glycol diacrylate. Hexanediol diacrylate is preferred because it provides adequate cure speed, flexibility, and exceptionally low moisture permeability. Alkylene diacrylate is included to increase the moisture resistance of the resulting coating.

PHOTOINITIATOR

Also required in the composition is a photoinitiator. The photoinitiator is a compound that generates free radicals when exposed to ultraviolet light. The free radicals then initiate the addition polymerization of the acrylate groups in the composition. Photoinitiators are well known to those skilled in the art. They are often mixtures of several different compounds and are frequently proprietary. Examples of photoinitiators that can be used include isobutylbenzoin ether (IBE), 2,2-dimethoxy-2-phenyl acetylphenone, sold as "Irq 651" by Ciba-Gigy, diethoxyacetophenone, diethoxyphenyl actophenone, and 2-hydroxy-2-methyl-1-phenyl-propan-1-one.

FLOW CONTROL AGENT

While not required, it is preferable to include a flow control agent in the composition as the presence of a flow control agent significantly improves the electrical properties of the coating. In particular, it lowers the dielectric constant and raises the electric strength and the resistivity. The flow control agent also greatly reduces the moisture permeability of the coating. Suitable flow control agents are well known in the art. Examples of suitable flow control agents include alkylphenol ethoxylate, alcohol ethoxylate, fluorinated alkyl alkoxylate, and ether sulfate. The preferred flow control agent is a fluorinated alkyl alkoxylate, such as "FC-171," sold by the 3M Company, because it gives good results.

Various other compounds may be included in the composition as desired including, for example, isobornyl acrylate (IBA) for hard and low shrinkage coating, and dyes or pigments that are UV transparent.

PROPORTIONS

The compositions are prepared by thoroughly mixing the various components. The amount of the first resin should be from 20 to 50% (based on total composition weight) as less may make the resulting coating too brittle and more may make the resulting coating too viscous. A preferred amount of the first resin is from 35 to 45%. The amount of the second resin should be at least 2% because less may result in a coating which is not tough enough and more than 10% may result in a brittle coating. The preferred amount of the second resin is from 4 to 6%. The third resin is optional, but is preferably present in an amount up to 50% as if more than 50% is used, the composition may be too viscous. The preferred amount of the third resin is about 20 to about 45%, as less than 20% may result in a brittle coating. The amount of additional liquid mono-acrylate should be at least 10% as less may cause the composition to be too viscous and more than 40% may result in a slow cure and a coating that is too soft. The preferred percentage of liquid acrylate is from 30 to 35%. The amount of liquid diacrylate having an ether linkage should be at least 2% as less may result in a high viscosity and poor adhesion of the coating to the substrate and more than 20% may increase the moisture permeability of the coating; the preferred amount is from 4 to 7%. The amount of liquid alkylene diacrylate is at least 5% as less will result in poor moisture permeability and more than 25% may result in poor adhesion of the coating; the preferred amount is from 7 to 15%. The photoinitiator should be present in an amount of at least 1% as less may result in a slow reaction, and more than 5% may result in poor film properties, such as hardness and flexibility; the preferred amount is from 3 to 4%. The composition preferably includes up to 1% of the flow control agent; more than 1% may reduce the adhesion of the coating to the substrate. A preferred amount of flow control agent is from 0.05 to 0.1%, as less than 0.05% may result in a rougher coating and poor moisture permeability.

The coating may be applied to a substrate by dipping, spraying, or almost any other technique. After it is applied to the substrate, it is exposed to ultraviolet light (Fusion System's D Bulb, 300 watt/in) for a few seconds, typically from 2 to 4 seconds, which results in the free radical chain polymerization of the unreacted acrylate groups. The UV curable conformable coating of this invention can be used on printed wiring boards, as a wire coating, as a protective coating for metals, as electrical insulation, and for various other uses as will no doubt occur to those skilled in the art.

The following examples further illustrate this invention.

EXAMPLES

Preparation Of First Resin

Into a 600 ml stainless steel beaker equipped with a stirrer, thermometer, and heating mantle, was charged 192.1 grams TMA, 116.1 grams HEA, and 2.6 grams benzoquinone. The reactants were heated to 120° C. for 1.5 hours.

A five liter reaction flask equipped with a stirrer, thermometer, nitrogen sparge, and heating mantle was charged with 66.0 grams of the above-made reaction product along with 1949.0 grams of a bisphenol A epoxy resin having an epoxy equivalent weight of 2000, sold by Shell Chemical Co. under the trade designation "Epon 1007F,"1992 grams PEA, and 1.19 grams of triethanolamine. The reactants were heated to 140° to 150° C. for 1.5 hours to an acid number below 5.

Preparation Of Second Resin

A 1 liter reaction flask equipped with a stirrer, thermometer, nitrogen sparge, and heating mantle was charged with 348.2 grams TDI (80% of the 2,4 isomer and 20% of the 2,6 isomer), and 0.12 grams benzoquinone. Keeping the exotherm temperature below 60° C., 232.2 grams of HEA was added step-wise. The reaction was continued at 60° C. for 1 hour, and 226.2 grams of caprolactam was added. The reaction was continued at 100° C. for 1 hour and 201.5 grams of PEA was added.

Preparation Of Third Resin

The reaction was carried out in the same way as the preparation of the first acrylate-epoxy resin except that 5 mole percent of the bisphenol A was replaced with an epoxy novolac having an epoxy equivalent weight of 176, sold by Dow Chemical Co. as "DEN 431."The following tables give the various compositions that were made and their properties. Competing UV conformal coatings are included in the table for comparison.

| | COMPOSITIONS OF UV CONFORMAL COATINGS | | | | | | | | | | |
|---|---|---|---|---|---|---|---|---|---|---|---|
| | % Weight Composition | | | | | | | | | | |
| Formulation | First Resin | Second Resin | Third Resin | PEA | TEGDA | HDDA | IBE | "Irq 651" | IBA | "FL-171" | cps/r.t. |
| "F-13"* | 57.6 | 6.45 | — | 24.1 | 7.98 | — | 3.85 | — | — | — | 5000 |
| A | 46.1 | 5.16 | — | 29.3 | 16.38 | — | 3.85 | — | — | — | 1320 |
| B | 46.1 | 5.16 | — | 31.5 | 6.38 | 7.48 | 3.85 | — | — | — | 1480 |
| C | 46.1 | 5.16 | — | 31.5 | 6.38 | 7.48 | 3.85 | — | — | 0.1 | 1016 |
| D | 46.1 | 5.16 | — | 29.3 | 6.38 | 10.00 | 3.85 | — | — | — | 1400 |
| E | 38.26 | 4.28 | — | 26.15 | 5.30 | 22.81 | 3.20 | 0.55 | — | — | 540 |
| F | 38.26 | 4.28 | — | 34.45 | 5.30 | 14.51 | 3.20 | 0.55 | — | — | 620 |
| G | 38.26 | 4.28 | — | 34.45 | 5.30 | 14.51 | 3.20 | 0.55 | — | 0.1 | 410 |
| H** | — | 6.45 | 57.6 | 14.1 | 7.98 | — | 3.85 | — | 10.0 | — | 5000 |

*A UV curable modified epoxy resin described in U.S. Pat. No. 4,481,258.
**Outside scope of invention.

| | PHYSICAL PROPERTIES OF CONFORMAL COATINGS | | | | | | | | | |
|---|---|---|---|---|---|---|---|---|---|---|
| | % Cross-Hatch Adhesion (1) | | | Pencil Hardness (2) | | | Thermal Shock (3) ½", 180° C. ½ hr | Specific Permeability (4) mg/cm mm Day | | |
| Coatings | Aluminum | Copper | FR-4 (5) | Aluminum | Copper | FR-4 | Al Substrate | 1 | 10 | 15 |
| "F-13" | 100 | 100 | 100 | 2H | HB | HB | OK | 0.5334 | 1.768 | 2.126 |
| A | 100 | 80 | 100 | H | H | H | Fail | 0.3660 | 2.177 | 2.5337 |
| B | 100 | 100 | 100 | H | HB | HB | OK | 0.2657 | 1.649 | — |
| C | 100 | 100 | 100 | — | — | — | OK | 0.2449 | — | — |
| D | 100 | 41 | 100 | 2H | HB | 2H | OK | 0.1413 | 1.554 | — |
| E | 100 | 0 | 100 | 3H | <F | 2H | Fail | — | — | — |
| F | 100 | 75 | 100 | 2H | H | 2H | OK | 0.4401 | 1.4460 (7 days) | — |
| G | 100 | 100 | 100 | — | — | — | OK | 0.1816 | — | — |
| H | 100 | 100 | 100 | 2H | H | H | OK | 0.5133 | — | 1.843 |
| "Parylene" (6) | 0 | 100 | 100 | — | — | — | — | 0.6109 | 2.096 | — |
| "UV-1244" (7) | 0 | 0 | 100 | <F | <F | HB | Fail | — | — | — |
| "UV-920" (8) | 100 | 100 | 100 | HB | — | — | OK | 0.4378 | — | 2.698 |
| "1B31" (9) | 65 | 100 | 100 | — | — | — | OK | 0.4544 | — | 7.577 |

(1) ASTM Special Technical Publication 500, 1972, G. G. Sward, Ed.
(2) ASTM Special Technical Publication 500, 1972, G. G. Sward, Ed.
(3) Mil-Spec. MIL-I-46,058C
(4) Fed. Test Mtd. 141a, Mtd. 6171
(5) A flame retardant epoxy laminate.
(6) A commercial conformal coating composition believed to be "Parylene."
(7) A commercial conformal coating composition believed to be cycloaliphatic epoxy.
(8) A commercial conformal coating composition believed to be acrylate thioene.
(9) A commercial conformal coating composition believed to be solvent based acrylates.

| | ELECTRICAL PROPERTIES OF CONFORMAL COATINGS | | | | |
|---|---|---|---|---|---|
| Coating | Dissipation Factor % 25° C., 1 MHz | Dielectric Constant 25° C., 1 MHz | Dielectric Strength (ASTM) V/Mil D149) | Resistivity Volume —cm | (ASTM D257) Surface |
| B | 2.99–3.10 | 3.6–3.8 | 2347 | 2.1 × 10 | 6.2 × 10 |
| C | 2.0 | 3.4 | 3280 | 3.0 × 10 | >10 |
| F | 2.0 | 4.5 | 2727 | 1.0 × 10 | 1.9 × 10 |
| G | 2.0 | 3.1 | 2540 | 9.5 × 10 | >10 |
| "UV 920" | 2.59–2.79 | 3.2–3.5 | 1980 | 6.5 × 10 | 3.8 × 10 |
| "UV 1244" | 2.71–2.82 | 3.8–4.0 | 2303 | 2.4 × 10 | 1.7 × 10 |

The above tables show that the compositions of this invention had excellent physical and electrical properties, especially when a flow control agent was included in the composition, and that the compositions were generally superior to competing UV curable conformal coatings.

| EXAMPLE I FS-1 | |
|---|---|
| Trimellitic anhydride (TMA) | 192.1 |
| Hydroxyethyl acrylate (HEA) | 116.1 |
| Benzoquinone | 2.6 |

HEA and benzoquinone are charged into a container. TMA is added portion-wise until an exothermic reaction occurs and the mixture is reacted to about 120° C. to 135° C. for about 1½ hours until the composition starts to cake.

| BT-4888 | |
|---|---|
| Toluene diisocyanate (TDI) | 553.5 |
| Benzoquinone | 0.38 |
| Hydroxyethyl acrylate (HEA) | 369.1 |
| Caprolactam | 360.0 |
| Phenoxyethyl acrylate (PEA) | 752.5 |

Using a nitrogen sparge, TDI is charged into a vessel. Benzoquinone is dissolved in HEA. The benzoquinone and HEA are added slowly with stirring, while temperature is maintained at below about 60° C. The reactants are then heated for about one hour at about 60° to 70° C. after the addition is completed. Caprolactam is added and reacted for about half an hour at about 100° C. The reactants are cut with PEA.

| | |
|---|---|
| Phenoxyethyl acrylate (PEA) | 801.8 |
| Epon 1007F | 784.6 |
| FS-1 (BT-4808) | 26.6 |
| Triethanolamine (TEA) | 0.43 |
| Tetraethyleneglycol diacrylate (TEGDA) | 223.3 |
| Hexanediol diacrylate (HDDA) | 268.1 |
| BT-4888 | 229.6 |
| Phenoxyethyl acrylate (PEA) | 1053.5 |
| Vicure 10 | 134.75 |
| FC-171 | 3.52 |

Using a nitrogen sparge, the Epon 1007F, a bisphenol A epoxy, (Shell) is dissolved in PEA at about 130° C. The FS-1 is then added and the mixture is reacted at about 145° C. for about one hour and until the composition reaches an acid number of L5. The composition is then cooled and TEGDA, HDDA, BT 4888 and PEA are added. When the temperature reaches about 50° C., the Vicure 10 is added and the composition is filtered.

EXAMPLE II

| | |
|---|---|
| Phenoxyethyl acrylate (PEA) | 665.5 |
| Epon 1007F | 651.2 |
| FS-1 | 22.1 |
| Triethanolamine (TEA) | 0.36 |
| Tetraethyleneglycol diacrylate (TEGDA) | 185.5 |
| Hexanediol diacrylate (HDDA) | 507.85 |
| BT-4888 | 190.4 |
| Phenoxyethyl acrylate (PEA) | 1165.1 |
| Vicure 10 | 112.0 |
| Irqacure 651 | 19.25 |
| FC-171 | |

Example II is prepared as in Example I.

I claim:

1. A UV curable composition comprising:
   (a) about 20 to 50% by weight, based on total composition weight, of a first resin having ethylenic unsaturation and an epoxy group and a molecular weight of from 2000 to 5000, prepared by reacting an anhydride or a diacid with a hydroxy acrylate followed by a reaction with a bisphenol diepoxide;
   (b) about 2 to 10% by weight, based on total composition weight, of the reaction product of a diisocyanate with a hydroxy acrylate to form a urethane followed by a reaction with caprolactam;
   (c) from about 20 to about 45% by weight, based on total composition weight, of a third resin having a molecular weight of from 2000 to 5000, prepared by reacting an anhydride or a diacid with a hydroxy acrylate followed by a reaction with epoxy comprising 1 to 5 mole percent of an epoxy novolac having more than two epoxy groups and 95 to 99 mole percent of a bisphenol diepoxide;
   (d) from 10 to 40% by weight, based on total composition weight, of a liquid acrylate selected from the group consisting of phenol ethoxylate monoacrylate, tetrahydrofurfuryl methacrylate, n-hexyl methacrylate, 2-(2-ethoxethoxy) ethyl acrylate and phenoxyethyl acrylate;
   (e) from 2 to 20% by weight, based on total composition weight, of a liquid ether diacrylate selected from the group consisting of tetraethyleneglycol diacrylate, diethylene glycol diacrylate, ethoxylated bisphenol A diacrylate, and tripropylene glycol diacrylate;
   (f) from 5 to 25% by weight, based on total composition weight, of a liquid alkylene diacrylate selected from the group consisting of hexanediol diacrylate, ethylene glycol diacrylate, 1,3-butylene glycol diacrylate, 1,4-butanediol diacrylate and neopentyl glycol diacrylate; and
   (g) from 1 to 5% by weight, based on total composition weight, of a UV photoinitiator.

2. A composition according to claim 1 wherein (a) is from 35 to 45%, (b) is about 4 to about 6%, (d) is about 30 to about 35%, (e) is about 4 to about 7%, (f) is about 7 to about 15%, (g) is about 3 to about 4%, and about 0.05 to about 0.1% by weight, based on total composition weight of (f) a flow control agent.

3. A composition according to claim 1 wherein said hydroxy acrylate is 2-hydroxyethyl acrylate, said anhydride or diacid is trimellitic anhydride, and said epoxy is a bisphenol A epoxy.

4. A composition according to claim 1 wherein said diisocyanate is tolylene diisocyanate and the hydroxy acrylate is 2-hydroxyethyl acrylate.

5. A composition according to claim 1 wherein said liquid acrylate in (D) is phenoxyethyl acrylate.

6. A composition according to claim 1 wherein said liquid diacrylate containing an ether linkage is tetraethyleneglycol diacrylate.

7. A composition according to claim 1 wherein said liquid alkylene diacrylate is hexanediol diacrylate.

8. A composition according to claim 1 wherein said photoinitiator includes isobutyl benzoin ether.

9. A composition according to claim 1 which includes from about 0.05 to about 1% by weight, based on total composition weight, of a flow control agent.

10. A composition according to claim 9 wherein said flow control agent is a fluorinated alkyl alkoxylate.

11. A composition according to claim 1 in the form of a cured thin film conformal coating on a substrate comprising a printed wiring board.

12. A method or protecting a substrate comprising electronic components mounted on a printed wiring board with a conformal coating comprising forming a film of a composition according to claim 1 on said substrate and exposing said film to UV light.

13. A UV curable resin comprising:
   (a) about 20 to 50% by weight, based on total composition weight, of a first resin having ethylenic unsaturation and an epoxy group and a molecular weight from 2000 to 5000 prepared by reacting trimellitic anhydride with hydroxyethyl acrylate followed by a reaction with bisphenol diepoxide;
   (b) about 2 to 20% by weight, based on total composition weight, of the reaction product of totylene diisocyanate with hydroxyethyl acrylate to form a urethane followed by a reaction with caprolactam;
   (c) from about 20 to about 45% by weight, based on total composition weight, of a third resin having a molecular weight of from 2000 to 5000 prepared by reacting trimellitic anhydride with hydroxyethyl acrylate followed by a reaction with epoxy comprising 1 to 5 mole percent of an epoxy novolac having more than two epoxy groups and 95 to 99 mole percent of a disphenol diepoxide;

(d) from 10 to 40% by weight, based on total composition weight, of phenoxyethyl acrylate;

(e) from 2 to 20% by weight, based on total composition weight, of tetraethylene glycol diacrylate;

(f) from 5 to 25% by weight, based on total composition weight, of hexanediol diacrylate; and (g) from 1 to 5% by weight, based on total composition weight, of a UV photoinitiator.

14. A composition according to claim 13 wherein (a) is from 35 to 45% (b) is about 4 to about 6%, (d) is about 30 to about 35%, (e) is about 4 to about 7%, (f) is about 7 to about 15%, (g) is about 3 to about 4%, and about 0.05 to about 0.1% by weight, based on total composition weight of (f) a flow control agent.

15. A composition according to claim 13 in the form of a cured thin film conformal coating on a substrate comprising a printed wiring board.

16. A conformal coating on a substrate including electronic components on a printed wiring board where said coating comprises a composition according to claim 13 cured with ultraviolet light.

* * * * *